United States Patent

Huang et al.

(10) Patent No.: US 10,854,545 B1
(45) Date of Patent: Dec. 1, 2020

(54) ANTI-FUSE STRUCTURE

(71) Applicant: NANYA TECHNOLOGY CORPORATION, New Taipei (TW)

(72) Inventors: Chin-Ling Huang, Taoyuan (TW); Chiang-Lin Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/583,287

(22) Filed: Sep. 26, 2019

(51) Int. Cl.
*H01L 23/525* (2006.01)
*H01L 21/768* (2006.01)

(52) U.S. Cl.
CPC .... *H01L 23/5252* (2013.01); *H01L 21/76801* (2013.01); *H01L 21/76838* (2013.01)

(58) Field of Classification Search
None
See application file for complete search history.

(56) References Cited

U.S. PATENT DOCUMENTS

2009/0206381 A1\* 8/2009 Shin .................. H01L 27/11206
257/300
2019/0131238 A1\* 5/2019 Chang ................ H01L 23/5252

\* cited by examiner

*Primary Examiner* — Thien F Tran
(74) *Attorney, Agent, or Firm* — CKC & Partners Co., LLC

(57) ABSTRACT

An anti-fuse structure includes a substrate, an active layer, an electrode layer, and a dielectric layer. The active layer is on the substrate and has a body portion and a convex portion protruding from the body portion. The electrode layer is on the active layer and partially overlaps the convex portion of the active layer. The electrode layer has a hollow region, and the convex portion of the active layer is in the hollow region. The dielectric layer is between the active layer and the electrode layer.

16 Claims, 3 Drawing Sheets

ANTI-FUSE STRUCTURE

BACKGROUND

Field of Invention

The present disclosure relates to an anti-fuse structure.

Description of Related Art

In recent years, anti-fuse technology has attracted significant attention of many inventors, IC designers and manufacturers. An anti-fuse is a structure alterable to a conductive state, or in other words, an electronic device that changes state from not conducting to conducting. Specifically, the anti-fuse structure has a high resistance initially (i.e., in the off state) before a voltage is applied thereto. As the applied voltage exceeds a certain extent, the anti-fuse structure forms a permanent passage.

SUMMARY

The present disclosure relates in general to an anti-fuse structure.

According to an embodiment of the present disclosure, an anti-fuse structure includes a substrate, an active layer, an electrode layer, and a dielectric layer. The active layer is on the substrate and has a body portion and a convex portion protruding from the body portion. The electrode layer is on the active layer and partially overlaps the convex portion of the active layer. The electrode layer has a hollow region, and the convex portion of the active layer is in the hollow region. The dielectric layer is between the active layer and the electrode layer.

In an embodiment of the present disclosure, the convex portion of the active layer has an end section surrounded by the electrode layer.

In an embodiment of the present disclosure, a width of the hollow region is larger than a width of the end section of the convex portion of the active layer.

In an embodiment of the present disclosure, an area of the hollow region is A, and an area of the electrode layer is B, and a ratio of A to (A+B) is in a range from 0.3 to 0.4.

In an embodiment of the present disclosure, the anti-fuse structure further includes a conductive layer on the electrode layer and covering the hollow region.

In an embodiment of the present disclosure, the anti-fuse structure further includes a first conductive structure and a second conductive structure. The first conductive structure extending upwardly from the conductive layer. The second conductive structure extending upwardly from the active layer.

In an embodiment of the present disclosure, the anti-fuse structure further includes a protecting structure surrounding the electrode layer and the conductive layer.

In an embodiment of the present disclosure, the dielectric layer is further between the active layer and the protecting structure.

In an embodiment of the present disclosure, the hollow region is in a shape of rectangle.

In an embodiment of the present disclosure, a corner of the hollow region has a curved section.

In an embodiment of the present disclosure, the anti-fuse structure further includes a protecting structure surrounding the electrode layer.

In an embodiment of the present disclosure, a sidewall of the body portion of the active layer is substantially aligned with a sidewall of the electrode layer.

In an embodiment of the present disclosure, a thickness of the dielectric layer is in a range from 25.0 Å to 50.8 Å.

In an embodiment of the present disclosure, the convex portion of the active layer has a section overlapped with the electrode layer, an area of the section is C, and an area of the convex portion of the active layer is D, and a ratio of C to D is in a range from 0.4 to 0.5.

In an embodiment of the present disclosure, the anti-fuse structure further includes an isolation structure between the substrate and the active layer.

In an embodiment of the present disclosure, a vertical projection area of the active layer on the substrate entirely overlaps a vertical projection area of the isolation structure on the substrate.

In the aforementioned embodiments of the present disclosure, since the electrode layer has the hollow region therein, and the convex portion of the active layer is in the hollow region, current generated by an applied voltage can flow through the electrode layer via two paths before reaching the dielectric layer. In other words, the current can flow through the electrode layer via either of the two paths in case one of the two paths breaks down. As such, a chance of failure to the anti-fuse structure can be decreased.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
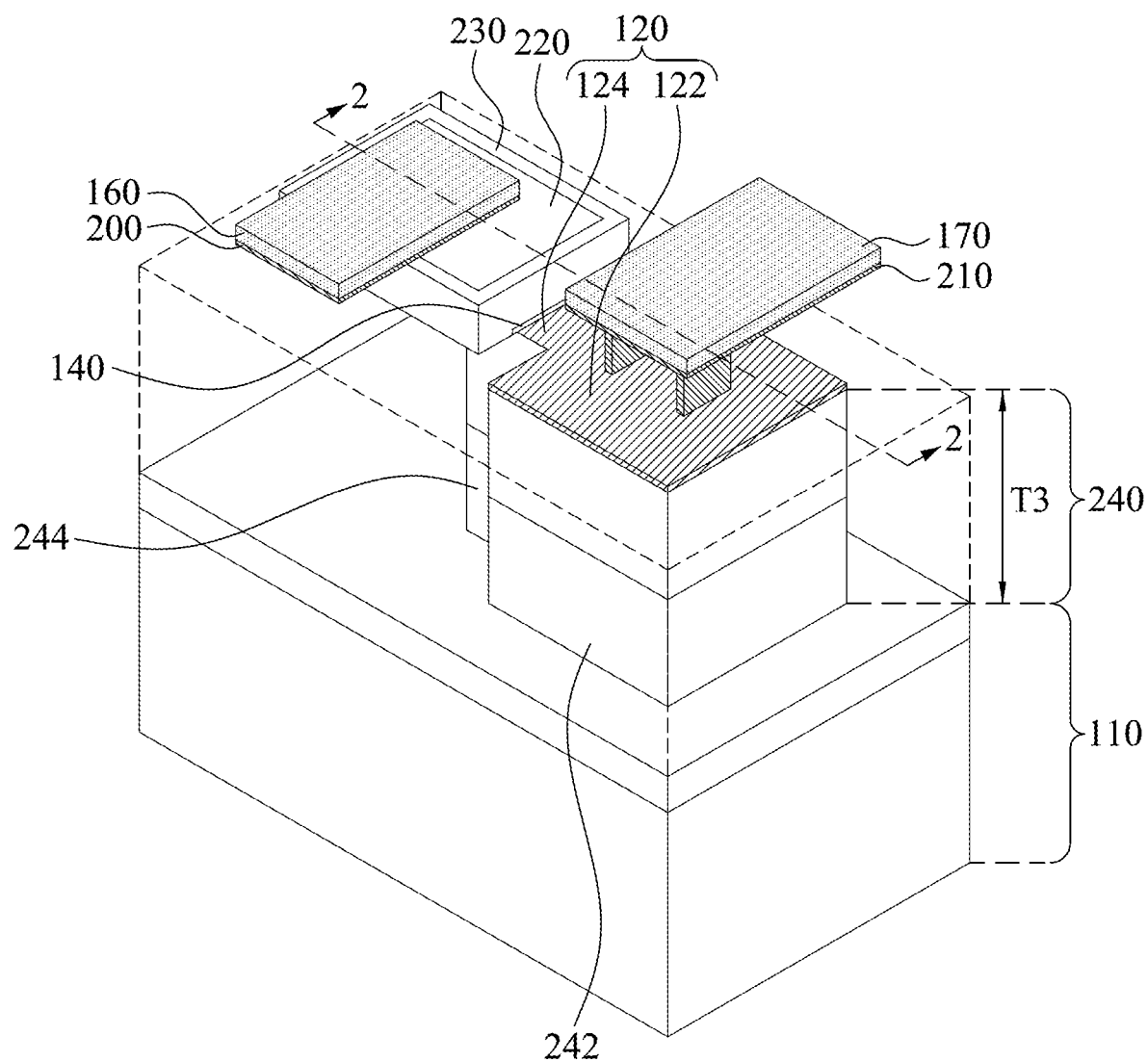
FIG. 1 is a perspective view illustrating an anti-fuse structure according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
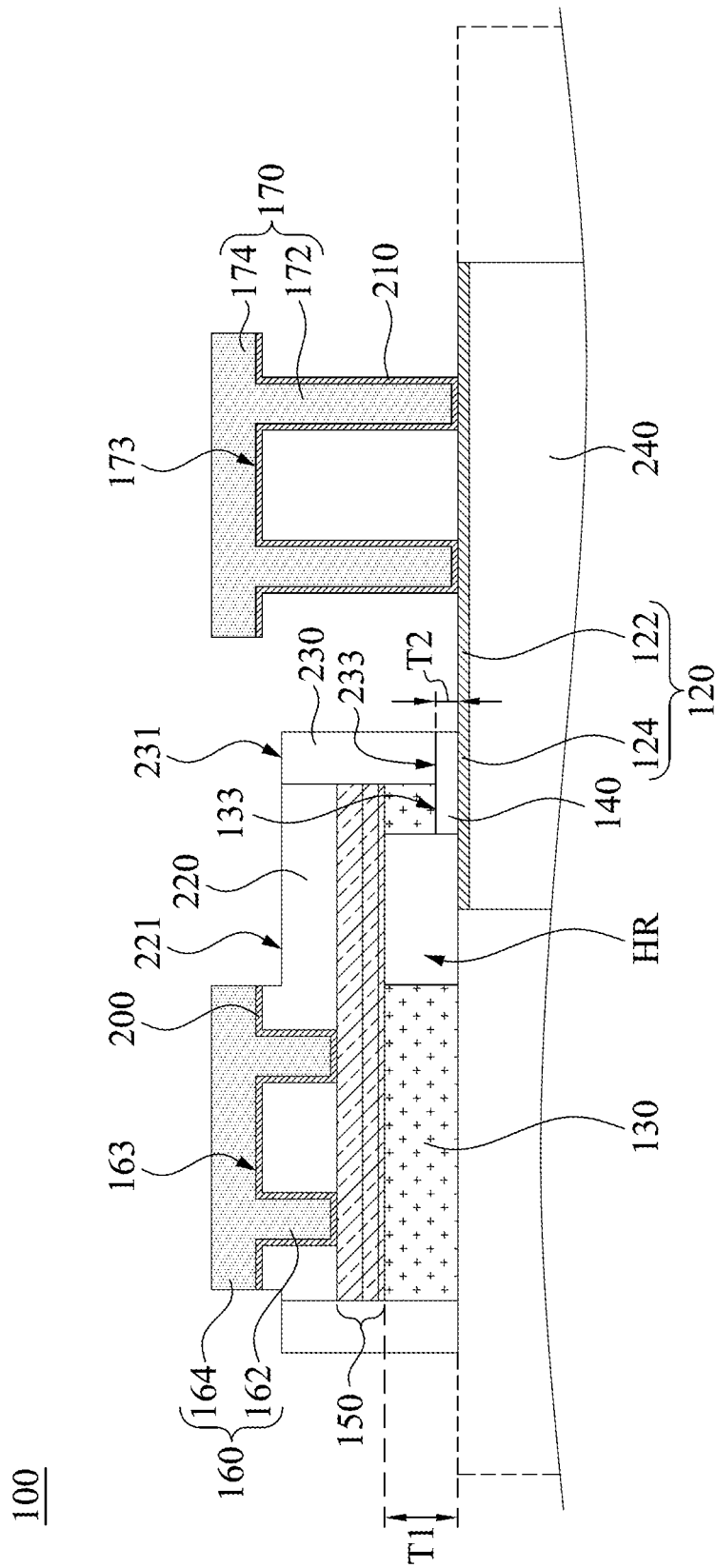
FIG. 2 is a cross-sectional view illustrating the anti-fuse structure taken along line 2-2 shown in FIG. 1.

FIG. 1 is a perspective view illustrating an anti-fuse structure 100 according to an embodiment of the present disclosure. FIG. 2 is a cross-sectional view illustrating the anti-fuse structure 100 taken along line 2-2 shown in FIG. 1. Reference is made to FIG. 1 and FIG. 2. The anti-fuse structure 100 includes a substrate 110, an active layer 120, an electrode layer 130, and a dielectric layer 140. The active layer 120 is on the substrate 110 and has a body portion 122 and a convex portion 124 protruding from the body portion 122. The electrode layer 130 is on the active layer 120 and partially overlaps the convex portion 124 of the active layer 120. The electrode layer 130 has a hollow region HR, and the convex portion 124 of the active layer 120 is in the hollow region HR. The dielectric layer 140 is between the active layer 120 and the electrode layer 130. In some embodiments, the active layer 120 and an electrode layer 130 may be made of a conductive material, and the dielectric layer 140 may be made of an insulating material with high resistance such as oxide. Furthermore, a thickness T1 of the electrode layer 130 is in a range from 45 nm to 55 nm, but the present disclosure is not limited in this regard.

When a low voltage is applied to the anti-fuse structure 100, the dielectric layer 140 remains intact and insulated, and low current generated by the low applied voltage is unable to flow through the dielectric layer 140. The anti-fuse structure 100 in such a state is referred to as an "off" state. When the applied voltage exceeds a certain extent, the dielectric layer 140 breaks down due to high current generated by the high applied voltage, and a permanent passage is formed from the electrode layer 130 to the active layer 120. The anti-fuse structure 100 in such a state is referred to as an "on" state (or a "conductive" state). Users can find out whether the anti-fuse structure 100 is in the "on" state or the "off" state by calculating the resistance through a value of the current flow.

Since the electrode layer 130 has the hollow region HR therein, and the convex portion 124 of the active layer 120 is in the hollow region HR, the current generated by the applied voltage can flow through the electrode layer 130 via two paths before reaching the dielectric layer 140. In other words, the current can flow through the electrode layer 130 via either of the two paths in case one of the two paths breaks down. As such, a chance of failure to the anti-fuse structure 100 can be decreased.

In some embodiments, the anti-fuse structure 100 further includes at least one conductive layer 150 on the electrode layer 130 and covering the hollow region HR. For example, as shown in FIG. 2, the anti-fuse structure 100 may include three conductive layers 150 stacked on the electrode layer 130. However, a number of the conductive layer 150 can be adjusted as deemed necessary by designers. Furthermore, when the number of the conductive layer 150 is plural, a vertical projection area of each of the conductive layers 150 on the substrate 110 may overlap each other.

In some embodiments, the anti-fuse structure 100 further includes at least one first conductive structure 160 and at least one second conductive structure 170. The first conductive structure 160 extends upwardly from the conductive layer 150, and the second conductive structure 170 extends upwardly from the active layer 120. For example, as shown in FIG. 2, the first conductive structure 160 has two vertical portions 162 extending in parallel with each other on the conductive layer 150, and the second conductive structure 170 has two vertical portions 172 extending in parallel with each other on the body portion 122 of the active layer 120. In alternative embodiments, one of the two vertical portions 162 of the first conductive structure 160 stands over the hollow region HR, and the other of the two vertical portions 162 of the first conductive structure 160 stands over the electrode layer 130.

In some embodiments, the first conductive structure 160 further includes a horizontal portion 164 disposed on the two vertical portions 162. The horizontal portion 164 extends laterally over the two vertical portions 162 of the first conductive structure 160. In other words, an extending direction of the horizontal portion 164 is perpendicular to an extending direction of the two vertical portions 162. In some embodiments, the two vertical portions 162 and the horizontal portion 164 are integrally formed as a single piece without an interface therebetween. In alternative embodiments, the horizontal portion 164 may be independent elements such as traces, wires, or other conductive elements connected to the two vertical portions 162.

In some embodiments, the second conductive structure 170 further includes a horizontal portion 174 disposed on the two vertical portions 172. The horizontal portion 174 extends laterally over the two vertical portions 172 of the first conductive structure 170. In other words, an extending direction of the horizontal portion 174 is perpendicular to an extending direction of the two vertical portions 172. In some embodiments, the two vertical portions 172 and the horizontal portion 174 are integrally formed as a single piece without an interface therebetween. In alternative embodiments, the horizontal portion 174 may be independent elements such as traces, wires, or other conductive elements connected to the two vertical portions 172.

Specifically, the anti-fuse structure 100 can be electrically connected to other external electronic devices through the first conductive structure 160 and the second conductive structure 170. For example, the first conductive structure 160 electrically connects the electrode layer 130 of the anti-fuse structure 100 and an external electronic device, while the second conductive structure 170 electrically connects the active layer 120 of the anti-fuse structure 100 and another external electronic device.

When the anti-fuse structure 100 is in the "on" state, current generated by the applied voltage flows from an external electronic device to the first conductive structure 160, and then flows sequentially through the electrode layer 130, the active layer 120, and the second conductive structure 170 to reach another external electronic device.

In some embodiments, the anti-fuse structure 100 further includes a first barrier layer 200 and a second barrier layer 210. The first barrier layer 200 is between the two vertical portions 162 of the first conductive structure 160 and the conductive layer 150, around the two vertical portions 162 of the first conductive structure 160, and on a bottom surface 163 of the horizontal portion 164 of the first conductive structure 160. The second barrier layer 210 is between the two vertical portions 172 of the second conductive structure 170 and the active layer 120, around the two vertical portions 172 of the second conductive structure 170, and on a bottom surface 173 of the horizontal portion 174 of the second conductive structure 170. The first barrier layer 200 can prevent the first conductive structure 160 and the conductive layer 150 from corrupting each other, and the second barrier layer 210 can prevent the second conductive structure 170 and the active layer 120 from corrupting each other.

In some embodiments, the anti-fuse structure 100 further includes a first protecting structure 220 on the conductive layer 150. The two vertical portions 162 of the first conductive structure 160 and a portion of the first barrier layer 200 around the two vertical portions 162 of the first conductive structure 160 are embedded in the first protecting structure 220. Furthermore, the anti-fuse structure 100 further includes a second protecting structure 230 surrounding the electrode layer 130, the conductive layer 150, and the first protecting structure 220. Additionally, a portion of a top surface 221 of the first protecting structure 220 is substantially coplanar with a top surface 231 of the second protecting structure 230, and a portion of the top surface 221 of the first protecting structure 220 is higher than the top surface 231 of the second protecting structure 230, in which the portion of the top surface 221 is below the horizontal portion of the first conductive structure 160.

In some embodiments, the dielectric layer 140 is between the second protecting structure 230 and the active layer 120.

In other words, the dielectric layer 140 extends from a bottom surface 133 of the electrode layer 130 to a bottom surface 233 of the second protecting structure 230. In some embodiments, a thickness T1 of the dielectric layer 140 is in a range from 25.0 Å to 50.8 Å. The thickness T1 of the dielectric layer 140 can be adjusted in such a range as deemed necessary by designers. For example, a thicker dielectric layer 140 can withstand a higher applied voltage, while a thinner dielectric layer 140 breaks down at a higher applied voltage.

In some embodiments, the anti-fuse structure 100 further includes an isolation structure 240 (also referred to as a shallow trench isolation structure) between the substrate 110 and the active layer 120. The isolation structure 240 may be made of a material including oxide, nitride, or combinations thereof. Furthermore, a vertical projection area of the active layer 120 on the substrate 110 entirely overlaps a vertical projection area of the isolation structure 240 on the substrate 110. In other words, the isolation structure 240 also has a body portion 242 and a convex portion 244 protruding from the body portion 242, in which the body portion 242 of the isolation structure 240 overlaps the body portion 122 of the active layer 120, and the convex portion 244 of the isolation structure 240 overlaps the convex portion 124 of the active layer 120. Additionally, a thickness T3 of the isolation structure 240 is in a range from 335 nm to 345 nm, but the present disclosure is not limited in this regard.

Figure 3:
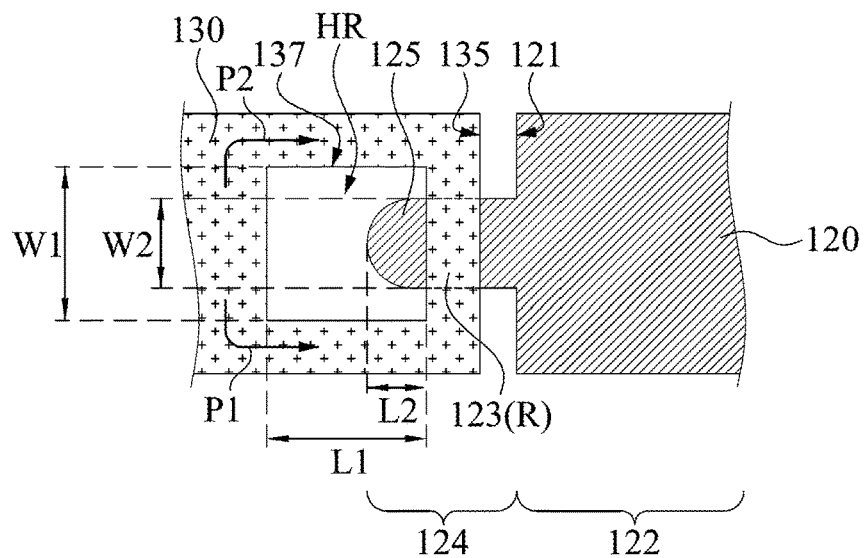
FIG. 3 is top view illustrating the active layer and the electrode layer of the anti-fuse structure shown in FIG. 1.

FIG. 3 is top view illustrating the active layer 120 and the electrode layer 130 of the anti-fuse structure 100 shown in FIG. 1. Reference is made to FIG. 2 and FIG. 3. The convex portion 124 of the active layer 120 has a section 123 overlapping the electrode layer 130, and the dielectric layer 140 is between the section 123 of the convex portion 124 and the electrode layer 130. Since the current is converged to a region R of the electrode layer 130 overlapping the section 123 of the convex portion 124, a current density in the region R of the electrode layer 130 is determined by an area of the section 123 of the convex portion 124. For example, a small area of the section 123 of the convex portion 124 leads to high current density in the region R of the electrode layer 130, which causes an easy breakdown of the dielectric layer 140. On the contrary, a large area of the section 123 of the convex portion 124 leads to low current density in the region R of the electrode layer 130, which causes a relatively difficult breakdown of the dielectric layer 140. However, the area of the section 123 of the convex portion 124 cannot be too small in case the current density in the region R of the electrode layer 130 reaches its upper limit and causes a rupture thereof. In some embodiments, the area of the section 123 of the convex portion 124 is C, and an area of the convex portion 124 of the active layer 120 is D, and a ratio of C to D is in a range from 0.4 to 0.5.

In some embodiments, an end section 125 of the convex portion 124 is in the hollow region HR, and a length L1 of the hollow region HR is larger than a length L2 of the end section 125 of the convex portion 124, and a width W1 of the hollow region HR is larger than a width W2 of the end section 125 of the convex portion 124. As such, the end section 125 of the convex portion 124 is surrounded by the electrode layer 130. In some embodiments, the end section 125 of the convex portion 124 is in a curved shape. In alternative embodiments, the end section 125 of the convex portion 124 is in a rectangular shape.

In some embodiments, an area of the hollow region HR is A, and an area of the electrode layer 130 is B, and a ratio of A to (A+B) is in a range from 0.3 to 0.4. The ratio of A to (A+B) in such a range ensures the sturdiness of the anti-fuse structure 100. Specifically, a large ratio of A to (A+B) implies a large area of the hollow region HR which makes the electrode layer 130 soft and fragile. On the contrary, a small ratio of A to (A+B) makes it difficult for the end section 125 of the convex portion 124 to be surrounded by the electrode layer 130.

In some embodiments, the hollow region HR is in a shape of rectangle in a top view. Since a rectangular shape includes straight lines vertically intersected with each other, it gives conveniences for the formation of the hollow region HR. Furthermore, since an outer edge 135 of the electrode layer 130 may also be in a shape of rectangle, the alignment of the hollow region HR to the electrode layer 130 can be easily achieved such that an inner edge 137 of the electrode layer 130 is substantially parallel to the outer edge 135 of the electrode layer 130.

Since the electrode layer 130 has the hollow region HR therein, and the convex portion 124 of the active layer 120 is in the hollow region HR, the current generated by the applied voltage can flow through the electrode layer 130 via two paths P1 and P2 of FIG. 3 before reaching the dielectric layer 140. In other words, the current can flow through the electrode layer 130 via either of the two paths in case one of the two paths breaks down. As such, a chance of failure to the anti-fuse structure 100 can be decreased.

It is to be noted that the connection relationships and materials of the elements described above will not be repeated in the following description, and only aspects related to other types of active layers and electrode layers will be described.

Figure 4:
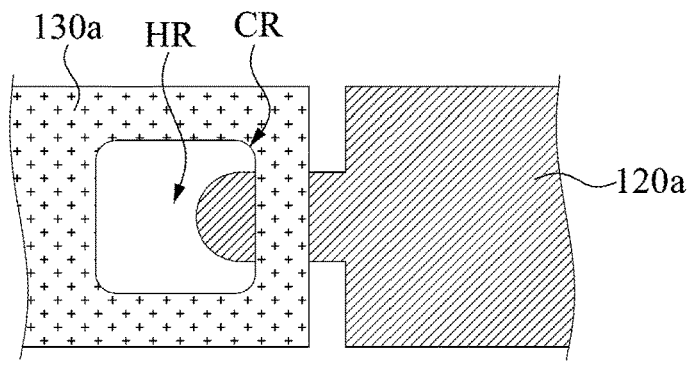
FIG. 4 is top view illustrating an active layer and an electrode layer of an anti-fuse structure according to another embodiment of the present disclosure.

FIG. 4 is top view illustrating an active layer 120a and an electrode layer 130a of an anti-fuse structure 100 according to another embodiment of the present disclosure. In the embodiment shown in FIG. 4, at least one corner CR of the hollow region HR of the electrode layer 130a has a curved section. For example, the hollow region HR of the electrode layer 130a may be in a shape of rectangle with four corners CR having four curved sections, respectively. The curved section can prevent the current from accumulating at the corner CR of the hollow region HR of the electrode layer 130a, such that the performance of the anti-fuse structure 100 can be enhanced.

Figure 5:
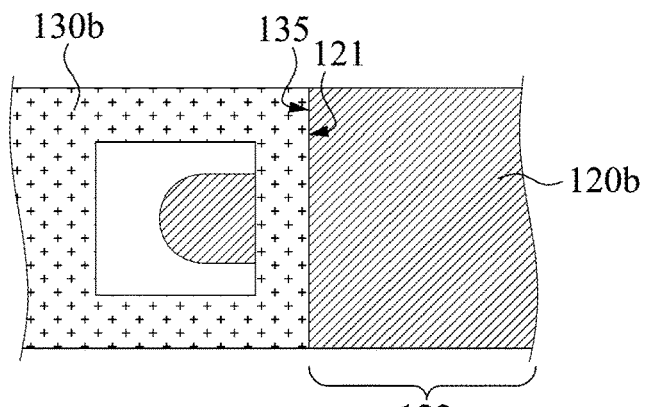
FIG. 5 is top view illustrating an active layer and an electrode layer of an anti-fuse structure according to another embodiment of the present disclosure.

FIG. 5 is top view illustrating an active layer 120b and an electrode layer 130b of an anti-fuse structure 100 according to another embodiment of the present disclosure. Reference is made to FIG. 3 and FIG. 5. In FIG. 3, a portion of the convex portion 124 is between a sidewall 121 of the body portion 122 of the active layer 120 and the outer edge 135 (or a sidewall 135) of the electrode layer 130. In FIG. 5, the sidewall 121 of the body portion 122 of the active layer 120b is substantially aligned with the sidewall 135 of the electrode layer 130b.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. An anti-fuse structure, comprising:
   a substrate;

an active layer on the substrate, wherein the active layer has a body portion and a convex portion protruding from the body portion;

an electrode layer on the active layer and partially overlapping the convex portion of the active layer, wherein the electrode layer has a hollow region, and the convex portion of the active layer is in the hollow region; and a dielectric layer between the active layer and the electrode layer.

2. The anti-fuse structure of claim 1, wherein the convex portion of the active layer has an end section surrounded by the electrode layer.

3. The anti-fuse structure of claim 2, wherein a width of the hollow region is larger than a width of the end section of the convex portion of the active layer.

4. The anti-fuse structure of claim 1, wherein an area of the hollow region is A, and an area of the electrode layer is B, and a ratio of A to (A+B) is in a range from 0.3 to 0.4.

5. The anti-fuse structure of claim 1, further comprising a conductive layer on the electrode layer and covering the hollow region.

6. The anti-fuse structure of claim 5, further comprising:
a first conductive structure extending upwardly from the conductive layer; and
a second conductive structure extending upwardly from the active layer.

7. The anti-fuse structure of claim 5, further comprising a protecting structure surrounding the electrode layer and the conductive layer.

8. The anti-fuse structure of claim 7, wherein the dielectric layer is further between the active layer and the protecting structure.

9. The anti-fuse structure of claim 1, wherein the hollow region is in a shape of rectangle.

10. The anti-fuse structure of claim 1, wherein a corner of the hollow region has a curved section.

11. The anti-fuse structure of claim 1, further comprising a protecting structure surrounding the electrode layer.

12. The anti-fuse structure of claim 1, wherein a sidewall of the body portion of the active layer is substantially aligned with a sidewall of the electrode layer.

13. The anti-fuse structure of claim 1, wherein a thickness of the dielectric layer is in a range from 25.0 Å to 50.8 Å.

14. The anti-fuse structure of claim 1, wherein the convex portion of the active layer has a section overlapped with the electrode layer, an area of the section is C, and an area of the convex portion of the active layer is D, and a ratio of C to D is in a range from 0.4 to 0.5.

15. The anti-fuse structure of claim 1, further comprising an isolation structure between the substrate and the active layer.

16. The anti-fuse structure of claim 15, wherein a vertical projection area of the active layer on the substrate entirely overlaps a vertical projection area of the isolation structure on the substrate.

* * * * *